United States Patent
Itagaki et al.

[11] Patent Number: 6,016,284
[45] Date of Patent: Jan. 18, 2000

[54] ADDRESS TRANSITION DETECTOR FOR MEMORY DEVICE

[75] Inventors: Toshihiro Itagaki; Sadao Yoshikawa, both of Gifu-ken, Japan

[73] Assignee: Sanyo Electric Company, Ltd., Osaka, Japan

[21] Appl. No.: 09/275,737

[22] Filed: Mar. 24, 1999

[30] Foreign Application Priority Data

Mar. 30, 1998 [JP] Japan .................................. 10-083633

[51] Int. Cl.[7] ...................................................... G11C 8/00
[52] U.S. Cl. ........................................ 365/233.5; 364/194
[58] Field of Search ................................ 365/233.5, 194; 326/93; 327/176

[56] References Cited

U.S. PATENT DOCUMENTS

| | | | |
|---|---|---|---|
| 5,706,246 | 1/1998 | Choi et al. ............................ | 365/233.5 |
| 5,815,464 | 9/1998 | Golla et al. .......................... | 365/233.5 |
| 5,875,152 | 2/1999 | Liu et al. ............................. | 365/194 X |

*Primary Examiner*—Huan Hoang
*Attorney, Agent, or Firm*—Sheridan Ross P.C.

[57] ABSTRACT

An address transition detector (ATD) for a memory device detects a change in an address signal and in response, produces a timing signal. The timing signal is used to align the timing of operation of a memory cell and a sense amp with the timing of the change in the address signal. The ATD includes a detection circuit for detecting a change in the address signal and a transistor having its gate connected to an output of the detection circuit, its source connected to ground and its drain connected to a first input terminal of a logic gate. An output of the logic gate is connected to an inverter. The output of the inverter is connected to a node between the transistor and the first input terminal of the logic gate. The output of the logic gate is also connected to a pair of series connected delay circuits. The output of the second delay circuit is input to a second input terminal of the logic gate. The first delay circuit delays the rising edge of the signal output from the logic gate and the second delay circuit delays the falling edge of the signal output from the logic gate.

8 Claims, 4 Drawing Sheets

ADDRESS TRANSITION DETECTOR FOR MEMORY DEVICE

BACKGROUND OF THE INVENTION

The invention relates to an address transition detector (ATD) for a memory device, and more particularly, to an address transition detector which detects a change in address information in order to produce a timing signal.

Referring to FIG. 1, a conventional semiconductor memory device 100 comprises a memory cell array 1, a decoder 2, a sense amp 3, an ATD 4 and a clock generator circuit 5.

The memory cell array 1 includes a plurality of memory cells, not shown, which are disposed in a plurality of rows and columns. Memory cells in respective rows and respective columns are connected to corresponding ones of a plurality of word lines and bit lines. The decoder 2 is connected to the memory cell array 1 and receives an address signal from a control circuit, not shown. Specifically, the decoder 2 activates one of the word lines and one of the bit lines in accordance with the address signal to select a memory cell within the memory cell array 1. The sense amp 3 is connected to the memory cell array 1. Information stored in the selected memory cell of the array 1 is read out in terms of a change in the potential of the bit line, and is then fed to the sense amp 3. The ATD 4 receives the address signal and detects a change therein to produce a timing signal, which is used to align the timing of the operation of the memory cell array 1 and the sense amp 3 with the timing of the change in the address signal. The clock generator circuit 5 is connected to the ATD 4 and receives a timing signal therefrom, and is also connected to the memory cell array 1 and the sense amp 3 to produce and clock signals in response to the timing signal which determine the timing of the operation of the array 1 and the sense amp 3.

A conventional ATD 4 will be described with reference to FIGS. 2 and 3, which are a circuit diagram of the ATD 4 and timing diagrams illustrating the operation thereof, respectively.

As shown in FIG. 2, the ATD 4 includes a number of detection circuit 4a and a shaper circuit 4b connected in series, which are equal in number to the number of bits in the address signal, it being understood that only one such series combination is shown. The detection circuit 4a produces a detection signal indicating the occurrence of a change in the address signal. The shaper circuit 4b receives the detection signal from the detection circuit 4a, and removes noise waveforms from the detection signal to deliver a shaped timing signal. A logical sum of the output signals from the individual shaper circuits 4b is formed to define a timing signal the ATD 4.

The detection circuit 4a includes an EXOR gate E1 and a delay element D1. The EXOR gate E1 has a first input terminal which directly receives the address signal and a second input terminal which is connected to the first terminal by way of the delay element D1. The delay element D1 has an input terminal connected to the first input terminal of the EXOR gate E1 and an output terminal connected to the second input terminal of the EXOR gate E1. The delay element D1 applies a given time delay to the address signal to provide a delayed address signal. The EXOR gate E1 delivers a detection signal of a high level whenever the two input signals are different from each other. Thus, the detection signal from the EXOR gate E1 rises in response to a transition in the address signal and falls when a delay time t1 of the delay element D1 passes thereafter, as shown in FIG. 3.

The shaper circuit 4b includes a delay element D2, a NAND gate N1 and an inverter I1. The NAND gate N1 has a first input terminal connected to the output terminal of EXOR gate E1 and a second input terminal connected to its own first input terminal through the delay element D2. The delay element D2 has an input terminal connected to the output terminal of the EXOR gate E1 and an output terminal connected to the second input terminal of NAND gate N1. The delay element D2 applies a given time delay to the detection signal it receives from the EXOR gate E1. The NAND gate N1 receives the detection signal from the detection circuit 4a at its first input terminal and receives a delayed detection signal through the delay element D2 at its second input terminal. An output signal from the NAND gate N1 is passed through the inverter I1 and delivered as a shaped signal. When the two input signals to the NAND gate N1 are high, the shaped signal is high. Thus, the shaped signal rises with a delay corresponding to the delay time t2 of the delay element D2 with respect to the rising edge of the detection signal, as will be noted from FIG. 3. Thus when the detection signal has a pulse width less than delay time t2, the shaper circuit 4b removes this pulse by regarding it as noise. Hence, if an inversion occurs temporarily in the detection signal as a result of noise being mixed with the address signal, the influence of such noise upon the shaped signal or timing signal is prevented.

If a temporary inversion of the address signal which is attributable to noise occurs, the detection signal contains two pulses, each rising at a timing when the resulting address signal falls and at a later timing which is delayed by the delay time t1 of the delay element D1 with respect to such fall. These two pulses are formed in the detection signal when the interval of inversion of the address signal is less than the delay time t1 of the delay element D1. When each pulse in the detection signal has a width greater than the delay time t2 of the delay element D2 in the shaper circuit 4b, the shaper circuit 4b is no longer capable of completely removing a pulse which occurs in the detection signal attributable to a noise. If the clock generator circuit 5 produces a clock signal based on a timing signal which results from such a shaped signal, a malfunctioning of the memory cell array 1 and the sense amp 3 may result. In such instance, data from the memory cell array 1 cannot be read correctly.

As an example, the sense amp 3 operates to detect a variation in the potential on the bit line as it is charged and discharged with a period which complies with the capacitance of the bit line and the rate of response of the memory cell array 1. However, if a clock signal were produced in response to a timing signal which is influenced by a noise or noises which occur indefinitely in time, the data read by the sense amp 3 in a stable manner is inhibited.

It is an object of the invention to provide an address transition detection circuit with an improved noise resistance.

SUMMARY OF THE INVENTION

In one aspect of the present invention, an address transition detector for a memory device includes a detection circuit for detecting a change in an address signal which specifies an address of one of a plurality of memory cells and producing a detection signal. A first logic gate has a first input terminal and a second input terminal and an output terminal. A transistor has a gate which receives the detection signal from the detection circuit and terminals connected to a given potential and the first input terminal of the first logic gate, respectively. An inverter has an input terminal connected to the output terminal of the first logic gate and an output terminal connected to the first input terminal of the first logic gate. A first delay circuit is connected to the output terminal of the first logic gate for delaying a rising edge of a signal output from the output terminal of the first logic gate. A second delay circuit is connected to the first delay circuit for delaying a falling edge of the delayed signal from the first delay circuit and for delivering a shaped signal to the second input terminal of the first logic gate.

Other aspects and advantages of the invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 5:
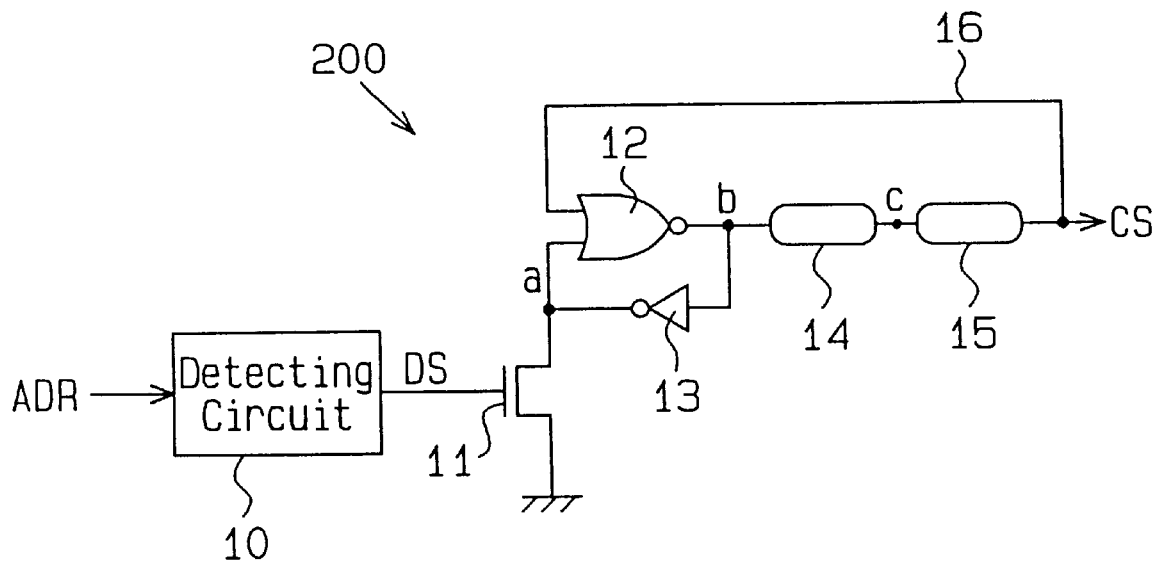
FIG. 5 is a circuit diagram of an ATD according to a first embodiment of the invention.
Figure 6:
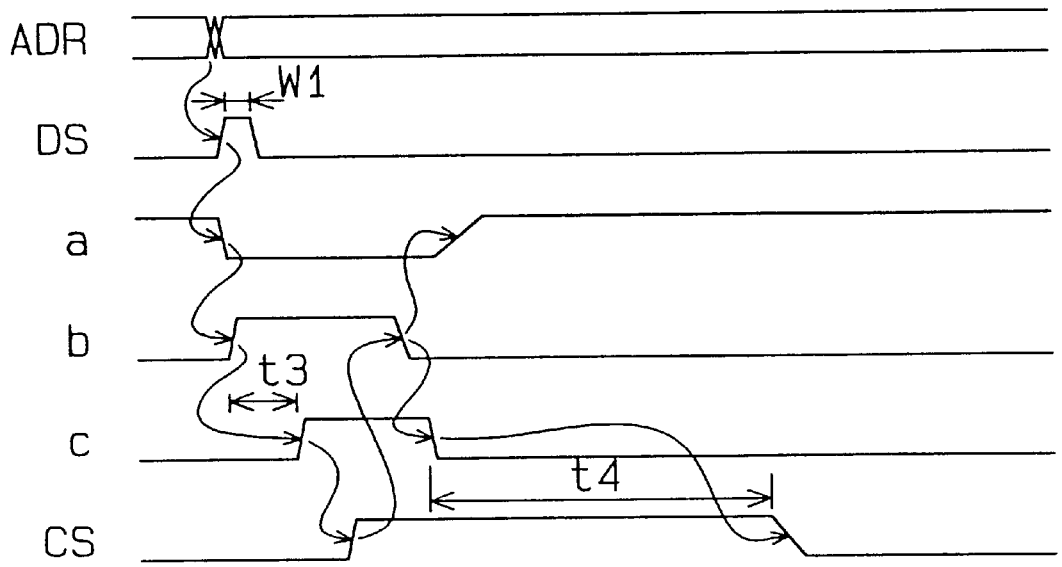
FIG. 6 is a timing diagram illustrating the operation of the ATD shown in FIG. 5.

Referring to FIGS. 5 and 6, an address transition detection (ATD) 200 according to a first embodiment of the invention will be described. The ATD 200 is designed for use with the conventional memory device 100, and comprises a detection circuit 10 which detects a change or transition in an address signal, an N-channel transistor 11, an NOR gate 12, an inverter 13 and a first and a second delay circuit 14, 15.

Figure 2:
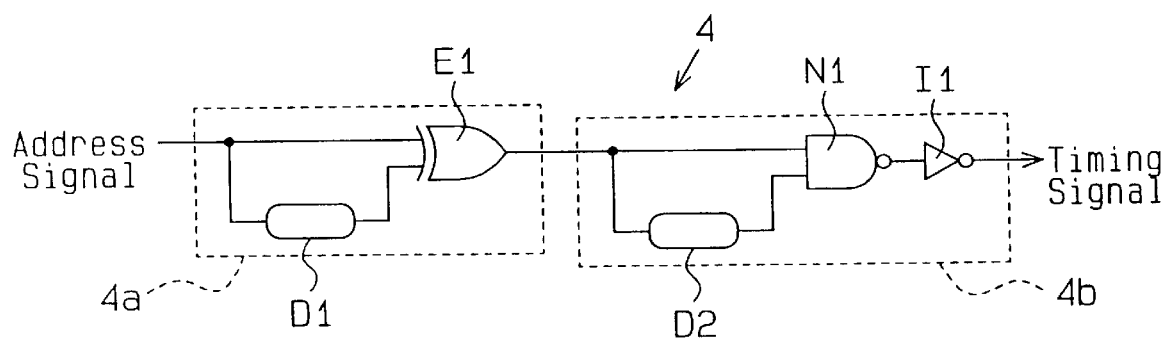
FIG. 2 is a circuit diagram of an ATD of the memory device shown in FIG. 1.
Figure 3:
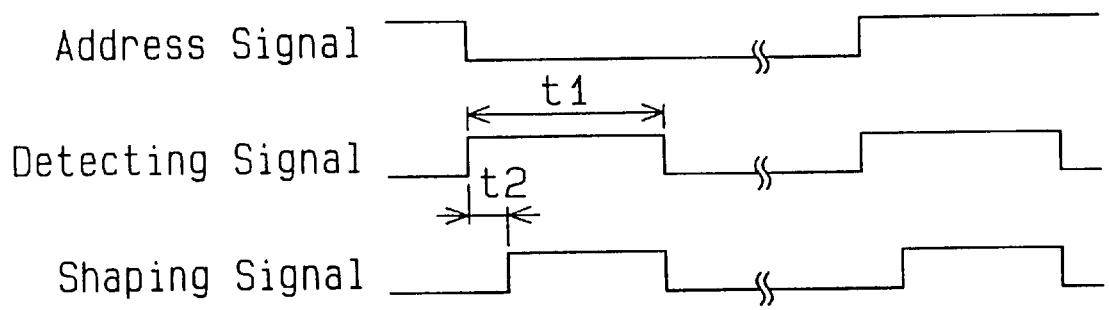
FIG. 3 is a timing diagram illustrating a first operation of the ATD shown in FIG. 2.

The detection circuit 10 has substantially the same function as the detection circuit 4a shown in FIG. 2, producing a detection pulse signal DS of a given width and having a rising edge which is coincident with either a rising edge or a falling edge of an address signal ADR. The detection circuit 10 may be similar to the detection circuit 4a shown in FIG. 2 or a different circuit may be used.

The transistor 11 has a gate connected to the output of the detection circuit 10, a grounded source, and a drain connected to the NOR gate 12 and the inverter 13. The transistor 11 receives a detection pulse signal DS from the detection circuit 10 at its gate.

Figure 1:
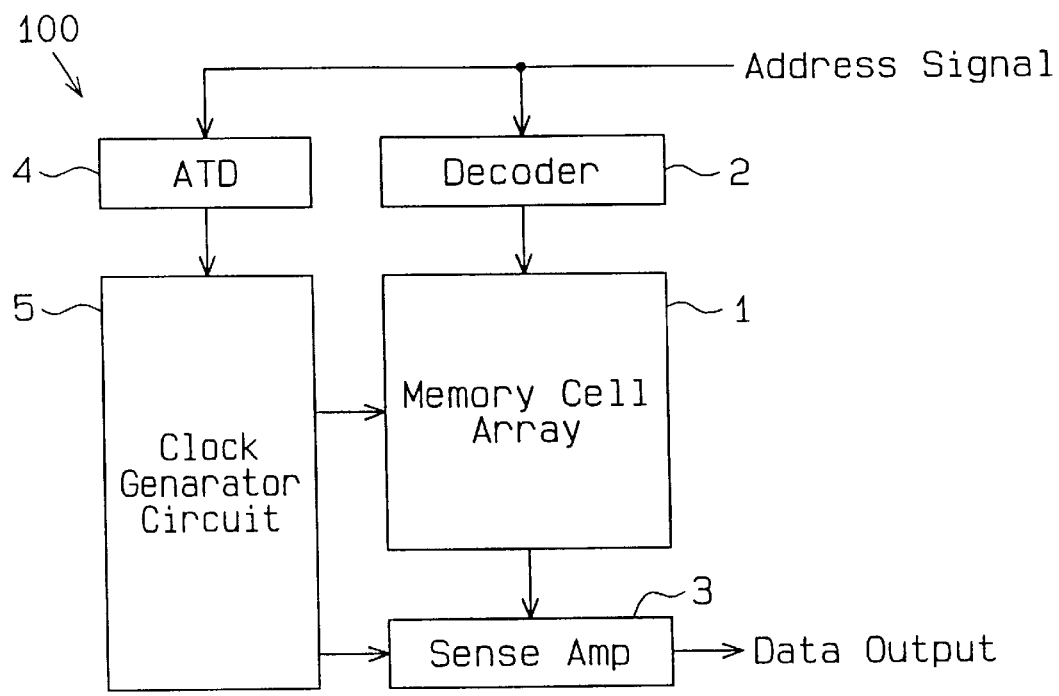
FIG. 1 is a schematic block diagram of a conventional mem device.

The NOR gate 12 has a first input terminal connected to the drain of the transistor 11, a second input terminal connected to a feedback path 16, and an output terminal. The inverter 13 has an input terminal connected to the output terminal of the NOR gate 12, and an output terminal connected to the first input terminal of NOR gate 12. The first and second delay circuits 14, 15 are connected in series to the output terminal of the NOR gate 12. The first and second delay circuits 14, 15 comprise a plurality of transistors, not shown, which are configured to form a common delay circuit each principally delaying either the rising edge or the falling edge of the input pulse. Specifically, the first delay circuit 14 receives a signal from the NOR gate 12 or a potential at a node b for delaying the rising edge of the signal by a delay time t3, while the second delay circuit 15 receives a delayed signal from the first delay circuit 14 or a potential at a node c for delaying the falling edge of the delayed signal by a delay time t4. The feedback path 16 is formed between the output terminal of the second delay circuit 15 and the second input terminal of the NOR gate 12. The delayed signal from the second delay circuit 15 is fed to the second input terminal of the NOR gate 12 and is also delivered as a shaped signal CS to the clock generator circuit 5 (see FIG. 1).

Figure 4:
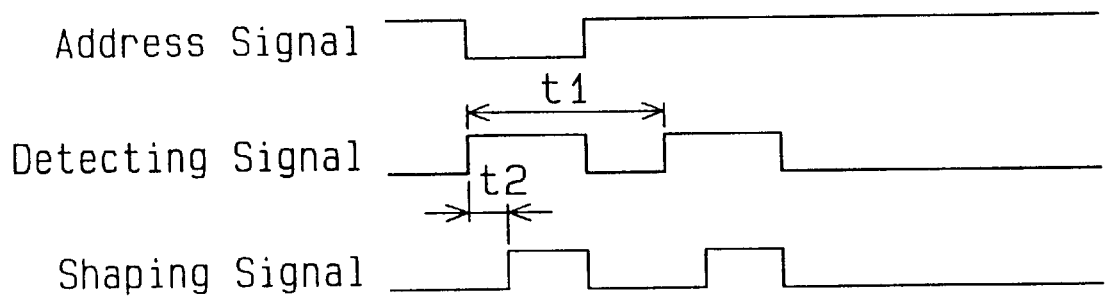
FIG. 4 is a timing diagram illustrating a second operation of the ATD shown in FIG. 2.

The operation of the ATD 200 will be described with reference to FIG. 6. If a momentary inversion of the address signal ADR as attributable to noise occurs, the detection circuit 10 detects such a change in the address signal ADR, and produces a detection pulse signal DS having a width W1. When the detection circuit 10 is substantially identical the detection circuit 4a shown in FIG. 2, there will be two pulse signals produced in succession as shown in FIG. 4. However, for the purpose of the present description, it is assumed that only a single pulse signal is produced.

The transistor 11 is turned on in response to the rising edge of the detection signal DS, whereby the drain of the transistor 11 or the first input terminal of the NOR gate 12 is grounded. While the inverter 13 is connected to the drain of the transistor 11 in addition to the NOR gate 12, the transistor 11 is designed with a driving capability which exceeds that of the inverter 13. Accordingly, a potential at a node a between the drain of the transistor 11 and the first input terminal of the NOR gate 12 will be brought down to the ground potential. The potential at the output terminal of the NOR gate 12 or a node b rises in response to the falling edge of the potential at the node a. The transistor 11 is turned off in response to the falling edge of the detection signal DS. If the transistor 11 is turned off subsequent to the potential rise at the node b, the potentials at the nodes a and b will be maintained in a stable manner. This is because the potentials at the nodes a and b are latched by the NOR gate 12 and the inverter 13, which are cross-coupled.

The first delay circuit 14 receives the pulse signal from the NOR gate 12, and delivers a pulse signal or a delayed signal which rises with a delay of the delay time t3 with respect to the rising edge of the detection signal DS. In other words, the potential at the node c rises lagging the rising edge of the potential at the node b by the delay time t3. The first delay circuit 14 principally causes a delay of the rising edge of the pulse signal, but does not cause any significant delay to its falling edge. Accordingly, the falling edge of the potential at the node c is not significantly lagging with respect to the falling edge of the potential at the node b.

The second delay circuit 15 receives the delayed signal from the first delay circuit 14 or the potential at the node c, and delivers a shaped signal CS which is lagging the falling edge of the delayed signal by a delay time t4. The second delay circuit 15 principally causes a delay of the falling edge of the delayed signal, but does not cause any significant delay of the rising edge. The output signal from the NOR gate 12 or the potential at the node b falls in response to the rising edge of the shaped signal CS. When the inverter 13 inverts in response to the falling edge of the potential at the node b, the potential at the node a rises since the transistor 11 is now turned off.

When the potential at the node c falls in response to the falling edge of the potential at the node b, the shaped signal CS falls lagging by the delay time t4 of the second delay circuit 15. If the shaped signal CS then falls, the potential at the node a is maintained at a level to which it has risen. Accordingly, the NOR gate 12 maintains the potential at the node b low, and thus stays in a standby condition waiting for the next detection signal DS to rise.

As described above, the shaped signal CS has a given pulse width independent from the pulse width W1 of the detection signal DS, and this given pulse width is in turn principally determined by the delay time t4 of the second delay circuit 15. Accordingly, if a detection pulse signal DS having a short width which is attributable to noise occurs, the pulse width of the shaped signal CS is sufficiently prolonged to allow the clock generator circuit 5 (FIG. 1) which receives the shaped signal CS to operate properly as when there is a transition in the address. With a normal functioning of the clock generator circuit 5, any malfunctioning of peripheral circuits such as the memory cell array 1 and the sense amp 3 is prevented. With a normal memory device, if a read operation is repeated when there is no transition in address information fed from a control circuit, not shown, there is no problem in the operation of the memory device. This is because the consequence is merely repeatedly reading data from the memory cell array at the same address, producing no change in the data output.

Figure 7:
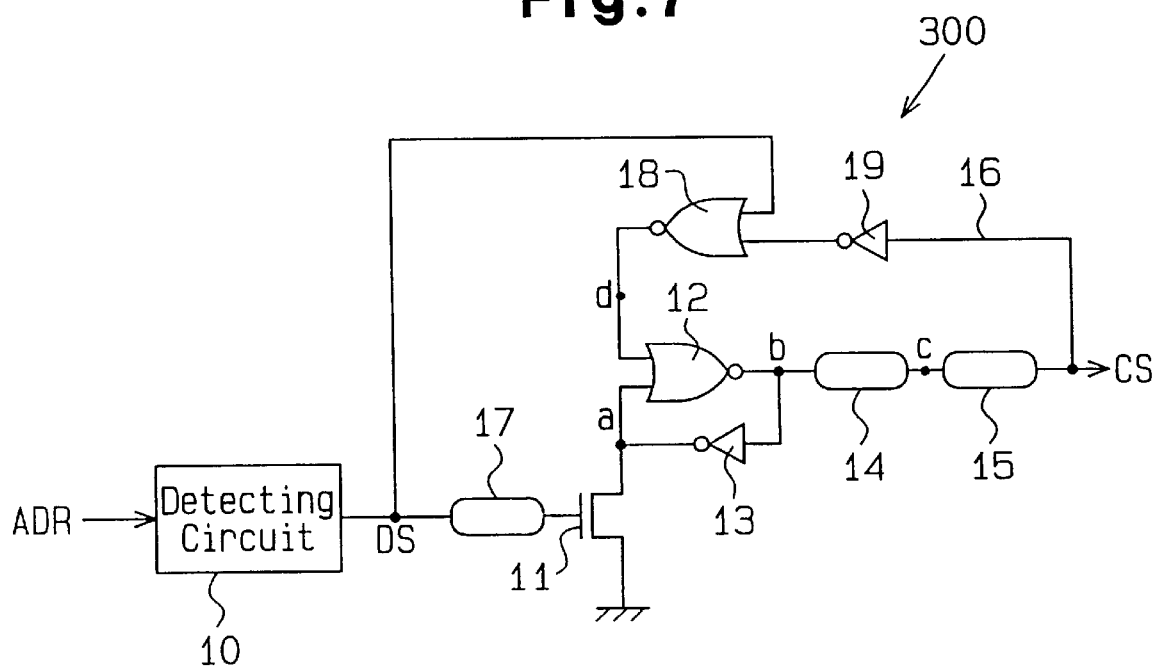
FIG. 7 is a circuit diagram of an ATD according to a second embodiment of the invention.
Figure 8:
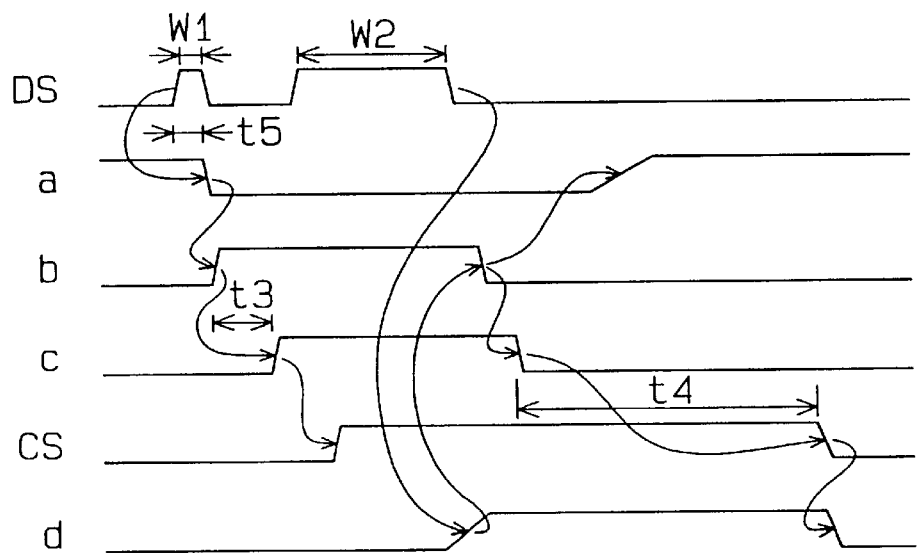
FIG. 8 is a timing diagram illustrating the operation of the ATD shown in FIG. 7.

An ATD 300 according to a second embodiment of the invention will now be described with reference to FIGS. 7 and 8. In the ATD 300 of the second embodiment, a third delay circuit 17, a second NOR gate 18 and a second inverter 19 are added to the ATD 200 of the first embodiment. The ATD 300 retards the timing of the falling edge of the shaped signal Cs when detection signals DS having short periods are produced in succession.

Specifically, the third delay circuit 17 is connected to a node between the output from the detection circuit 10 and the gate of the transistor 11, thus receiving the detection signal DS from the detection circuit 10 and delaying it by a delay time t5 before applying it to the gate of the transistor 11. The NOR gate 18 has a first input terminal connected to the junction between the detection circuit 10 and the third delay circuit 17, and a second input terminal connected to the output terminal of the second delay circuit 15 by way of the inverter 19. The NOR gate 18 receives the detection signal DS and the shaped signal CS at its first and second input terminals, respectively. The NOR gate 18 has an output terminal connected to the second input terminal of NOR gate 12. The inverter 19 has an input terminal connected to the feedback path 16 and an output terminal connected to the first input terminal of the NOR gate 18.

The operation of the ATD 300 will now be described with reference to FIG. 8. Here it is assumed that detection signals DS having the pulse width W1, W2 are produced due to noise.

When the detection signal DS rises, the transistor 11 is turned off with a lag corresponding to the delay time T5 of the third delay circuit 17, whereby the node a is grounded to lower the potential at the node a to the ground potential. In response to the low potential at the node a, the NOR gate 12 causes the potential at the node b to rise. The potentials at the nodes a and b are latched by the NOR gate 12 and the inverter 13, and are maintained in a stable manner independently from the on/off condition of the transistor 11.

In response to the potential rise at the node b, the first delay circuit 14 causes the potential at the node c to rise in lagging relationship by the delay time t3 from the potential rise at the node b. In response to the potential rise at the node c, the second delay circuit 15 delivers a shaped signal CS which rises in lagging relationship by a given delay time from the potential rise at the node c. It is to be noted that the potential fall at the node c is not significantly lagging with respect to the potential fall at the node b. Also, the rising edge of the shaped signal CS is not significantly lagging the potential rise at the node c. When the shaped signal CS rises, a signal which is inverted by the inverter 19 is fed to the second input terminal of NOR gate 18. If another detection signal DS having the pulse width W2 is produced at this time, the NOR gate 18 maintains the potential at its output terminal or node d at a low level. When the detection signal having the pulse width W2 falls, the NOR gate 18 raises the potential at the node d. In response to the potential rise at the node d, the NOR gate 12 causes the potential at the node b to fall. Compared with the first embodiment shown in FIG. 6, the timing of the potential fall at the node b is retarded by the pulse width W2 of the second detection signal DS. In response to the potential fall at the node b, the inverter 13 raises the potential at the node a.

When the potential at the node c falls in response to the potential fall at the node b, there is delivered the shaped signal CS which falls in lagging relationship by the delay time t4 from the timing of the potential fall. As the shaped signal CS falls, the combination of the inverter 19 and the NOR gate 18 causes the potential at the node d to fall while the potential at the node a is maintained at a level to which it has risen. Accordingly, if the potential at the node d falls, the NOR gate 12 maintains the potential at the node b at a low level, thus staying in a standby condition waiting for the detection signal DS to rise.

As described above, the shaped signal CS having a given pulse width independent from the pulse widths W1, W2 of the detection signals DS is generated. Accordingly, if detection signals having short periods attributable to noise are produced in succession, the falling edge of the shaped signal CS is delayed in a manner depending on these pulse widths. In the other example, the shaped signal CS is maintained at its high level from the falling edge of the second detection signal DS until a time corresponding to the delay time t4 of the second delay circuit 15 passes. It then follows that if a disturbance occurs in the address signal ADR due to noise, the shaped signal falls after the disturbance subsides and the signal is stabilized. As a consequence, designating an address at the time the shaped signal CS has fallen avoids any likelihood that a wrong address is designated, thus allowing a correct data read operation.

The present examples and embodiments are to be considered as illustrative and not restrictive and the invention is not to be limited to the details given herein, but may be modified within the scope and equivalence of the appended claims.

What is claimed is:

1. An address transition detector for a memory device, comprising:

a detection circuit for detecting a change in an address signal which specifies an address of one of a plurality of memory cells and producing a detection signal;

a first logic gate having a first input terminal and a second input terminal and an output terminal;

a transistor having a gate which receives the detection signal from said detection circuit and terminals connected to a given potential and the first input terminal of said first logic gate, respectively;

an inverter having an input terminal connected to the output terminal of said first logic gate and an output terminal connected to the first input terminal of said first logic gate;

a first delay circuit connected to the output terminal of the first logic gate for delaying a rising edge of a signal output from the output terminal of the first logic gate; and a second delay circuit connected to said first delay circuit for delaying a falling edge of the delayed signal from said first delay circuit and for delivering a shaped signal to the second input terminal of said the first logic gate.

2. The address transition detector according to claim 1, further comprising:

a third delay circuit connected between said detection circuit and the gate of said transistor for delaying the detection signal; and a second logic gate connected between said second delay circuit and the second input terminal of said first logic gate, the second logic gate having a first input terminal connected to a node between said detection circuit and said third delay circuit, a second input terminal which receives the shaped signal from said second delay circuit and an output terminal connected to the second input terminal of said first logic gate.

3. The address transition detector of claim 2, further comprising an inverter connected between the second logic gate and said second delay circuit.

4. The address transition detector of claim 3, wherein said first and second logic gates are NOR gates.

5. The address transition detector of claim 1, wherein a drive capability of said transistor exceeds a drive capability of said inverter.

6. An address transition detector for a memory device having a plurality of memory cells, the address transition detector comprising:

a detection circuit for detecting a change in an address signal which specifies an address of one of the plurality of memory cells and produces a detection signal in response thereto;

a first delay circuit having an input connected to said detection circuit for delaying the detection signal and producing a delayed detection signal;

a transistor having a gate connected to said first delay circuit and receiving the delayed detection signal, a source connected to ground, and a drain;

a first logic gate having a first input terminal connected to the drain of said transistor, and a second input terminal and an output terminal;

a first inverter having an input terminal connected to the output of said first logic gate and an output terminal connected to a node between the drain of said transistor and said first input terminal of the first logic gate;

a second delay circuit connected to the output terminal of said first logic gate;

a third delay circuit connected to an output of said second delay circuit;

a second inverter having an input terminal connected to an output of said third delay circuit; and a second logic gate having a first input terminal connected to an output of said second inverter, a second input terminal connected to a node between said detection circuit and said first delay circuit, and an output terminal connected to the second input terminal of said first logic gate.

7. The address transition detector of claim 6, wherein said first and second logic gates are NOR gates.

8. The address transition detector of claim 7, wherein a drive capability of said transistor exceeds a drive capability of said first inverter.

* * * * *